METHOD OF MAKING THYRISTORS HAVING ELECTRICALLY
INTERCHANGEABLE ANODES AND CATHODES

Filed Oct. 20, 1965

Inventors
ZENON J. KURPISZ
GERALD J. CONNOR
JAMES P. CURTIS
By [signature]
Attorney 3,435,515

METHOD OF MAKING THYRISTORS HAVING ELECTRICALLY INTERCHANGEABLE ANODES AND CATHODES

Zenon Jan Kurpisz, Gerald James Connor, and James Patrick Curtis, London, England, assignors to International Standard Electric Corporation, New York, N.Y., a corporation of Delaware Filed Oct. 20, 1965, Ser. No. 498,760
Claims priority, application Great Britain, Dec. 2, 1964, 48,962/64
Int. Cl. H01l 7/10, 7/16
U.S. Cl. 29—580 4 Claims

ABSTRACT OF THE DISCLOSURE

This is a method of making a thyristor which operates bi-directionally wherein a first region of one conductivity type is formed within a surface area of opposite conductivity; a second region forms a cathode of opposite conductivity within the first region on one surface and a third region of opposite conductivity is formed within the opposite surface; an annular groove is formed from said one surface extending into the body thereby separating said first region into a fourth and a fifth region, the fourth region encompasses the second region and the fifth region forms the anode; a gate electrode is formed within the second region and metal contacts are attached to the second region which shorts the cathode to the second region; and a metal contact is formed on the opposite surface which shorts the anode to the third region. This structure thus formed can act in a bi-directional fashion since the anode effectively has the same structure as the cathode and vice versa, thereby allowing the cathode to act as the anode and the anode to act as the cathode depending upon the gating pulse which is introduced.

Figure 1:
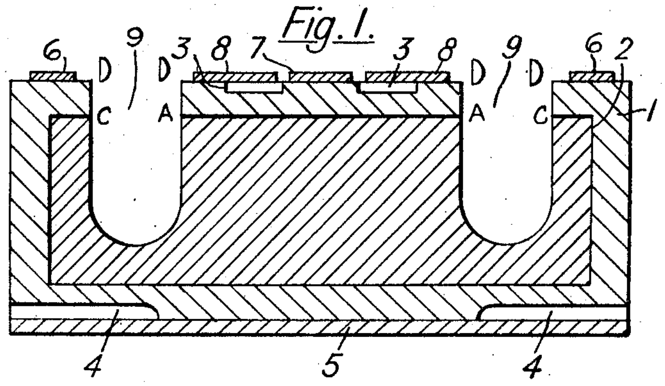

This invention relates to thyristors.

It is an object of the present invention to provide thyristors having substantially uniform forward and reverse characteristics.

According to one aspect of the present invention there is provided a method of fabricating a semiconductor thyristor comprising first, second, third, fourth and fifth regions, including the steps of diffusing an impurity into the surface of a semiconductor wafer of a first conductivity type, to form a layer of opposite conductivity type over the whole of the surface of the wafer, locally diffusing another impurity into a region or regions on both of the faces of said wafer to reconvert the conductivity of said regions to said first conductivity type, the local diffusions forming said first and fifth regions, etching or mechanically forming a moat on the face of said wafer containing said first region, the moat surrounding said first region and completely extending through the diffused layer into said third region and dividing the diffused layer into said second and said fourth regions, applying a first metallic contact to said first and said second regions and a second metallic contact to said fourth and said fifth regions, said first and second contacts serving interchangeably as anode and cathode, and further applying a contact or contacts to said second and/or said fourth layers, which contact or contacts serves or serve as control electrode or electrodes.

According to another aspect of the invention there is provided a method of fabricating a thyristor comprising first, second, third, fourth and fifth regions, including the steps of diffusing an impurity into the surface of a semiconductor wafer of a first conductivity type, to form a layer of opposite conductivity type over the whole of the surface of the wafer, locally diffusing another impurity into a region or regions on both of the faces of said wafer to reconvert the conductivity of said regions to said first conductivity type, the local diffusions forming said first and fifth regions, etching or mechanically forming a moat on the face of said water containing said first region the moat surrounding said first region and completely extending through the diffused layer into said third region and dividing the diffused region into said second and said fourth regions, applying a first metallic contact to said first and said second regions and a second metallic contact to said fourth and said fifth regions said first and second contacts serving interchangeably as anode and cathode, and further applying contacts to each of said second and said fourth regions which contacts serve as control electrodes.

According to yet another aspect of the invention there is provided a method of fabricating a thyristor comprising first, second, third, fourth and fifth regions including the steps of diffusing an impurity into the surface of a semiconductor wafer of a first conductivity type to form a layer of opposite conductivity type over the whole of the surface of the wafer to be subsequently divided into said second and fourth regions, locally diffusing another impurity into a region or regions on both of the faces of said wafer to reconvert the conductivity of said regions to said first conductivity type, the local diffusions forming said first and fifth regions, or diffusing a further region of said first conductivity type by diffusion within the part of said diffused layer to be formed into said second region, dividing the diffused layer into said second and said fourth regions by etching or mechanical means, applying a first metallic contact to said first and said second regions and a second metallic contact to said fourth and said fifth regions, said first and second contacts serving interchangeably as anode and cathode, and applying a further contact to said second and said further regions, which contact serves as a control electrode.

Figure 2:
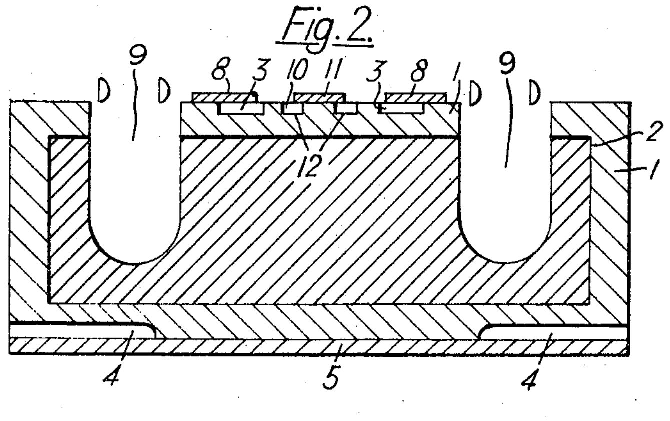

Specific embodiments of the invention will now be described with reference to the accompanying drawings in which:

FIGURE 1 shows in cross-section a five-region thyristor wafer having two control electrodes; and FIGURE 2 shows in cross-section a five-region thyristor wafer having a single composite control electrode.

In both embodiments the thyristor is fabricated in a wafer of n-type silicon of 20 to 40 ohm-cm. resistivity. The thickness of the wafer is approximately 200 microns and the diameter is related to the current handling capacity of the device in a manner well known to those skilled in the art.

A layer of silicon dioxide is grown on the surface of the wafer by heating it in oxygen saturated with water vapours at one hundred degrees centigrade, for a period of six hours at eleven hundred degrees centigrade. A layer of gallium is diffused into the surface of the silicon through the silicon dioxide layer to form a region 1 of p-type conductivity and a junction 2 at a depth of about 40 microns. The unconverted region of n-type material forms the base region of the device.

According to one embodiment shown in FIGURE 1, windows are etched through the oxide on both faces of the wafer and phosphorus diffused through the windows to form ring-shaped regions 3 and 4. It may be noted that the diffusifilities of gallium and phosphorus through silicon dioxide are markedly different, to the extent that the silica will act as a mask for phosphorus but not for gallium. Subsequently nickel is plated to form ohmic contacts at 5, 6, 7 and 8.

The silicon wafer is then masked over the whole of its surface, except for a ring DD, by a photolithographic process such as is commonly used in the manufacture of semiconductor devices. A moat 9 is etched with a mixture of hydrofluoric and nitric acids exposing the junction 2 at AC, so as to provide separated regions in the p-layer. The ohmic contacts 5, 6, 7 and 8 will provide electrodes for anode, gate and cathode regions.

Contacts 6 and 7 provide electrodes for the two gate regions of the device, electrodes 5 and 8 serving as shorted anode and cathode contacts. Since, as will be seen, the device is electrically symmetrical, electrode 5 may serve as anode and electrode 8 as cathode or vice versa.

A positive pulse applied to electrode 6 with respect to electrode 5 will trigger the device into the high conduction condition in one direction, whilst a positive pulse applied to electrode 7 with respect to electrode 8 will trigger the device in the other direction.

In the second embodiment shown in FIGURE 2 windows are etched through the oxide on both faces of the wafer and phosphorus diffused through the windows to form ring shaped regions 3, 4 and 10. Nickel is plated to make ohmic contacts at 5, 8 and 11.

The silicon wafer is then masked over the whole of its surface, except for a ring DD and a moat 9 etched to provide separated regions in the p-layer.

Contact 11 provides a composite electrode for the gate region. A positive pulse applied to the gate with respect to the cathode will trigger the device into a high conduction state when the device is biased in one direction whilst a negative pulse will trigger the device into a high conduction state when it is biased in the other direction. In this latter case regions 3, 1 and 12 act as a transistor in the saturated condition.

The position of the further diffused region 10 is determined by known methods so that the lateral transistor formed by 12, 1, 3 has sufficient current gain to trigger the thyristor into the conducting state. With the ring-shaped electrode structure of the device shown this is most conveniently achieved by positioning the diffused region at the periphery of the gate contact.

Although the embodiments have been described with reference to silicon, the principles involved are equally applicable to other semiconductor materials.

Also devices of complementary polarity could be made. Mechanical means, such as the use of air-abrasive techniques could be used instead of etching to divide the surface diffused layer into the two separate regions.

It is to be understood that the foregoing description of specific examples of this invention is made by way of example only and its not to be considered as a limitation on its scope.

What we claim is:

1. A method of fabricating a semiconductor thyristor comprising first, second, third, fourth and fifth regions, including the steps of diffusing an impurity into the surface of a semiconductor wafer of a first conductivity type, to form a layer of opposite conductivity type over the whole of the surface of the wafer, locally diffusing another impurity into a region on both of the faces of said wafer to reconvert the conductivity of said regions to said first conductivity type, the local diffusions forming said first and fifth regions, forming a moat on the face of said wafer containing said first region, the moat surrounding said first region and completely extending through the diffused layer into said third region and dividing the diffused layer into said second and said fourth regions, applying a first metallic contact to said first and said second regions and a second metallic contact to said fourth and said fifth regions, said first and second contacts serving interchangeably as anode and cathode, and further applying a contact to said second region, which contact serves as control electrode.

2. A method of fabricating a thyristor comprising first, second, third, fourth and fifth regions, including the steps of diffusing an impurity into the surface of a semiconductor wafer of a first conductivity type, to form a layer of opposite conductivity type over the whole of the surface of the wafer, locally diffusing another impurity into a region on both of the faces of said wafer to reconvert the conductivity of said regions to said first conductivity type, the local diffusions forming said first and fifth regions, forming a moat on the face of said wafer containing said first region the moat surrounding said first region and completely extending through the diffused layer into said third region, and dividing the diffused region into said second and said fourth regions, applying a first metallic contact to said first and said second regions and a second metallic contact to said fourth and said fifth regions, said first and second contacts serving interchangeably as anode and cathode, and further applying contacts to each of said second and said fourth regions which contacts serve as control electrodes.

3. A method of fabricating a thyristor comprising first, second, third, fourth and fifth regions including the steps of diffusing an impurity into the surface of a semiconductor wafer of a first conductivity type to form a layer of opposite conductivity type over the whole of the surface of the wafer to be subsequently divided into said second and fourth regions, locally diffusing another impurity into a region on both of the faces of said wafer to reconvert the conductivity of said regions to said first conductivity type, the local diffusions forming said first and fifth regions, diffusing a further region of said first conductivity type by diffusion within the part of said diffused layer to be formed into said second region, dividing the diffused layer into said second and said fourth regions, applying a first metallic contact to said first and said second regions and a second metallic contact to said fourth and said fifth regions, said first and second contacts serving interchangeably as anode and cathode, and applying a further contact to said second and said further regions, which contact serves as a control electrode.

4. A method as claimed in claim 1 wherein the moat extends more than halfway through the semiconductor wafer.

References Cited

UNITED STATES PATENTS

| | | | |
|---|---|---|---|
| 2,748,041 | 5/1956 | Leverenz | 29—583 X |
| 3,083,441 | 4/1963 | Little et al. | 29—583 |
| 3,209,428 | 10/1965 | Barbaro | 29—590 X |
| 3,249,831 | 11/1966 | New et al. | 29—580 |
| 3,271,636 | 9/1966 | Irvin | 29—580 |
| 3,320,485 | 5/1967 | Buie | 29—580 |
| 3,332,137 | 7/1967 | Kenney | 29—580 |
| 3,336,661 | 8/1967 | Polinsky | 29—589 |

FOREIGN PATENTS

| | | |
|---|---|---|
| 1,133,039 | 7/1962 | Germany. |

JOHN F. CAMPBELL, *Primary Examiner.*

PAUL M. COHEN, *Assistant Examiner.*

U.S. Cl. X.R.

29—583, 589, 590, 591